(12) United States Patent
Xu

(10) Patent No.: US 10,355,245 B2
(45) Date of Patent: Jul. 16, 2019

(54) OLED DISPLAY WITH DESICCANT LAYER AND PACKAGING METHOD FOR THE SAME

(71) Applicant: Wuhan China Star Optoelectronics Technology Co., Ltd., Wuhan, Hubei (CN)

(72) Inventor: Chao Xu, Guangdong (CN)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 144 days.

(21) Appl. No.: 15/325,143

(22) PCT Filed: Jan. 9, 2017

(86) PCT No.: PCT/CN2017/070623
§ 371 (c)(1),
(2) Date: Jan. 10, 2017

(87) PCT Pub. No.: WO2018/107555
PCT Pub. Date: Jun. 21, 2018

(65) Prior Publication Data
US 2018/0212195 A1    Jul. 26, 2018

(30) Foreign Application Priority Data
Dec. 15, 2016    (CN) .................. 2016 1 11615329

(51) Int. Cl.
*H01L 51/52*      (2006.01)
*H01L 51/56*      (2006.01)
*H01L 27/32*      (2006.01)

(52) U.S. Cl.
CPC ...... *H01L 51/5259* (2013.01); *H01L 51/5243* (2013.01); *H01L 51/5246* (2013.01); *H01L 51/56* (2013.01); *H01L 27/3244* (2013.01)

(58) Field of Classification Search
CPC .. H01L 51/5259; H01L 51/5243; H01L 51/56
USPC ............... 257/40; 438/28, 34, 476, 455, 456
See application file for complete search history.

(56) References Cited

U.S. PATENT DOCUMENTS

| 6,284,342 | B1 | 9/2001 | Ebisawa et al. |
| 2010/0301375 | A1 | 12/2010 | Chen et al. |
| 2013/0193842 | A1 | 8/2013 | Hoshina et al. |
| 2014/0167012 | A1 | 6/2014 | Sun et al. |
| 2015/0185142 | A1 | 7/2015 | Zeng et al. |

(Continued)

FOREIGN PATENT DOCUMENTS

| CN | 101064977 A | 10/2007 |
| WO | WO2009096250 A1 | 8/2009 |

*Primary Examiner* — Robert T Huber
(74) *Attorney, Agent, or Firm* — Andrew C. Cheng

(57) ABSTRACT

An OLED display and a packaging method for the same are disclosed. The method includes: forming a copper film layer on an OLED layer of a first substrate; forming a frame sealant at an outer peripheral edge of a second substrate; in a vacuum machine filled with hydrogen, pressing and bonding the first substrate and the second substrate; curing the frame sealant in order to seal hydrogen between the copper film layer and the second substrate. The OLED display includes a first substrate, a copper film layer, a desiccant layer and a second substrate. Hydrogen is filled between the copper film layer and the second substrate. The present invention can effectively increase the packaging effect and extends the operation life of the OLED display.

13 Claims, 3 Drawing Sheets

(56) References Cited

U.S. PATENT DOCUMENTS

2015/0221888 A1 8/2015 Zhang
2016/0268548 A1 9/2016 Yu

US 10,355,245 B2

OLED DISPLAY WITH DESICCANT LAYER AND PACKAGING METHOD FOR THE SAME

BACKGROUND OF THE INVENTION

1. Field of the Invention

The present invention relates to display technology field, and more particularly to an OLED display and packaging method for the same.

2. Description of Related Art

An OLED display has advantages of high brightness, fast response, low energy consumption, bendable so that the OLED is widely considered as a focus of next generation display technology. Comparing the OLED with TFT-LCD, the biggest advantage is capable of manufacturing a large sized, ultra-thin, flexible, transparent and double-sided display device.

Currently, an OLED display generally encounters a problem of short operation life. The main reason includes two aspects: firstly, an organic thin film is sensitive to water vapor and oxygen, which is easily to generate aging and degeneration because of water vapor and oxygen such that the brightness and the life are obviously decreased; secondly, in order to reduce the injection barrier of the electron, a cathode usually adopts a low work function metal which is more active in the chemical property. The above metal is easily to be oxidized so that the life of the device is decreased.

SUMMARY OF THE INVENTION

The present invention provides an OLED display and packaging method for the same, which is capable of solving the problem of decreased operation life because of damaging of OLED device by water and oxygen.

In order to solve the above technology problem, a technology solution adopted by the present invention is: providing a packaging method for an OLED display, comprising steps of: forming a copper film layer on an OLED layer of a first substrate through an evaporation method, wherein the first substrate includes an array substrate and the OLED layer formed on the array substrate; forming a frame sealant at an outer peripheral edge of a second substrate; forming a desiccant layer in a region inside the frame sealant of the second substrate; and in a vacuum machine filled with hydrogen, oppositely depositing a side of the first substrate formed with the copper film layer and a side of the second substrate formed with the desiccant layer; pressing and bonding the first substrate and the second substrate; curing the frame sealant in order to seal hydrogen between the copper film layer and the second substrate, wherein a pressure in the vacuum machine is 0.1-10 Pa.

Wherein, in the step of forming a desiccant layer in a region inside the frame sealant of the second substrate, the desiccant layer is a liquid desiccant, and the liquid desiccant is formed on the second substrate through coating.

Wherein, in the step of forming a desiccant layer in a region inside the frame sealant of the second substrate, the desiccant layer is a solid desiccant, and the solid desiccant is formed on the second substrate through adhering.

Wherein, in the step of forming a desiccant layer in a region inside the frame sealant of the second substrate, the desiccant layer is provided with a reserved space; after pressing and bonding the first substrate and the second substrate, the hydrogen is filled in the reserved space; the desiccant layer is contacted with the copper film layer.

In order to solve the above technology problem, another technology problem adopted by the present invention is: forming a copper film layer on an OLED layer of a first substrate, wherein the first substrate includes an array substrate and the OLED layer formed on the array substrate; forming a frame sealant at an outer peripheral edge of a second substrate; forming a desiccant layer in a region inside the frame sealant of the second substrate; and in a vacuum machine filled with hydrogen, oppositely depositing a side of the first substrate formed with the copper film layer and a side of the second substrate formed with the desiccant layer; pressing and bonding the first substrate and the second substrate; curing the frame sealant in order to seal hydrogen between the copper film layer and the second substrate.

Wherein, in the step of forming a copper film layer on an OLED layer of a first substrate, the copper film layer is formed on the OLED layer through an evaporation method.

Wherein, in the step of forming a desiccant layer in a region inside the frame sealant of the second substrate, the desiccant layer is a liquid desiccant, and the liquid desiccant is formed on the second substrate through coating.

Wherein, in the step of forming a desiccant layer in a region inside the frame sealant of the second substrate, the desiccant layer is a solid desiccant, and the solid desiccant is formed on the second substrate through adhering.

Wherein, in the step of in a vacuum machine filled with hydrogen, oppositely depositing a side of the first substrate formed with the copper film layer and a side of the second substrate formed with the desiccant layer; pressing and bonding the first substrate and the second substrate, a pressure in the vacuum machine is 0.1-10 Pa.

Wherein, in the step of forming a desiccant layer in a region inside the frame sealant of the second substrate, the desiccant layer is provided with a reserved space; after pressing and bonding the first substrate and the second substrate, the hydrogen is filled in the reserved space; the desiccant layer is contacted with the copper film layer.

Wherein, the desiccant is a liquid desiccant, the liquid desiccant is coated as multiple water-droplet shaped particles disposed separately or coated as a fence shape, a mesh shape, or a spiral shape.

Wherein, the desiccant is a solid desiccant, the solid desiccant is sheet-shaped, the sheet-shaped desiccant forms multiple holes as the reserved space; or, the number of the sheet-shaped desiccant is multiple, between adjacent sheet-shaped desiccants, a gap is reserved as the reserved space.

Wherein, the frame sealant is a UV curable adhesive.

In order to solve the above technology problem, another technology solution adopted by the present invention is: providing an OLED display, comprising: a first substrate including an array substrate and an OLED layer disposed on the array substrate; a copper film layer formed on the OLED layer; a desiccant layer disposed on the copper film layer; a second substrate disposed on the desiccant layer, and outer peripheral edges of the second substrate and the first substrate are connected and sealed through a frame sealant; wherein, hydrogen is filled between the copper film layer and the second substrate.

Wherein, the desiccant layer is a liquid desiccant or a solid desiccant.

Wherein, the desiccant layer forms a reserved space, the hydrogen is filled in the reserved space, and desiccant layer is contacted with the copper film layer.

Wherein, the desiccant is a liquid desiccant, the liquid desiccant is coated as multiple water-droplet shaped particles disposed separately or coated as a fence shape, a mesh shape, or a spiral shape.

Wherein, the desiccant is a solid desiccant, the solid desiccant is sheet-shaped, the sheet-shaped desiccant forms multiple holes as the reserved space; or, the number of the sheet-shaped desiccant is multiple, between adjacent sheet-shaped desiccants, a gap is reserved as the reserved space.

Wherein, desiccants in the desiccant layer are evenly distributed, and the reserved space is evenly distributed in the desiccant layer.

Wherein, the frame sealant is a UV curable adhesive.

The beneficial effects of the present invention are: comparing to the conventional art, the present invention forming a copper film layer on an OLED layer of a first substrate, forming a desiccant layer in a region inside the frame sealant of the second substrate, in a vacuum machine filled with hydrogen, oppositely depositing the copper layer and a side of the desiccant layer, then, pressing and bonding the first substrate and the second substrate, and curing the frame sealant in order to seal hydrogen between the copper film layer and the second substrate such that when $O_2$ enters inside the OLED display device, Cu in the copper layer will react with the $O_2$ to produce CuO so as to remove the $O_2$. When OLED display device emits light and generates heat, the CuO is reduced to Cu and produces $H_2O$. because the copper film layer and the desiccant layer are disposed oppositely so that the produced $H_2O$ can be absorbed by desiccant in the desiccant layer in order to prevent water and oxygen from damaging the OLED layer so that the packaging effect of the OLED display can be greatly increased so as to extend the operation life of the OLED display.

BRIEF DESCRIPTION OF THE DRAWINGS

In order to more clearly illustrate the technical solution in the present invention or in the prior art, the following will illustrate the figures used for describing the embodiments or the prior art. It is obvious that the following figures are only some embodiments of the present invention. For the person of ordinary skill in the art without creative effort, it can also obtain other figures according to these figures.

DETAILED DESCRIPTION OF THE PREFERRED EMBODIMENT

The following content combines with the drawings and the embodiment for describing the present invention in detail. It is obvious that the following embodiments are only some embodiments of the present invention. For the person of ordinary skill in the art without creative effort, the other embodiments obtained thereby are still covered by the present invention.

Figure 1:
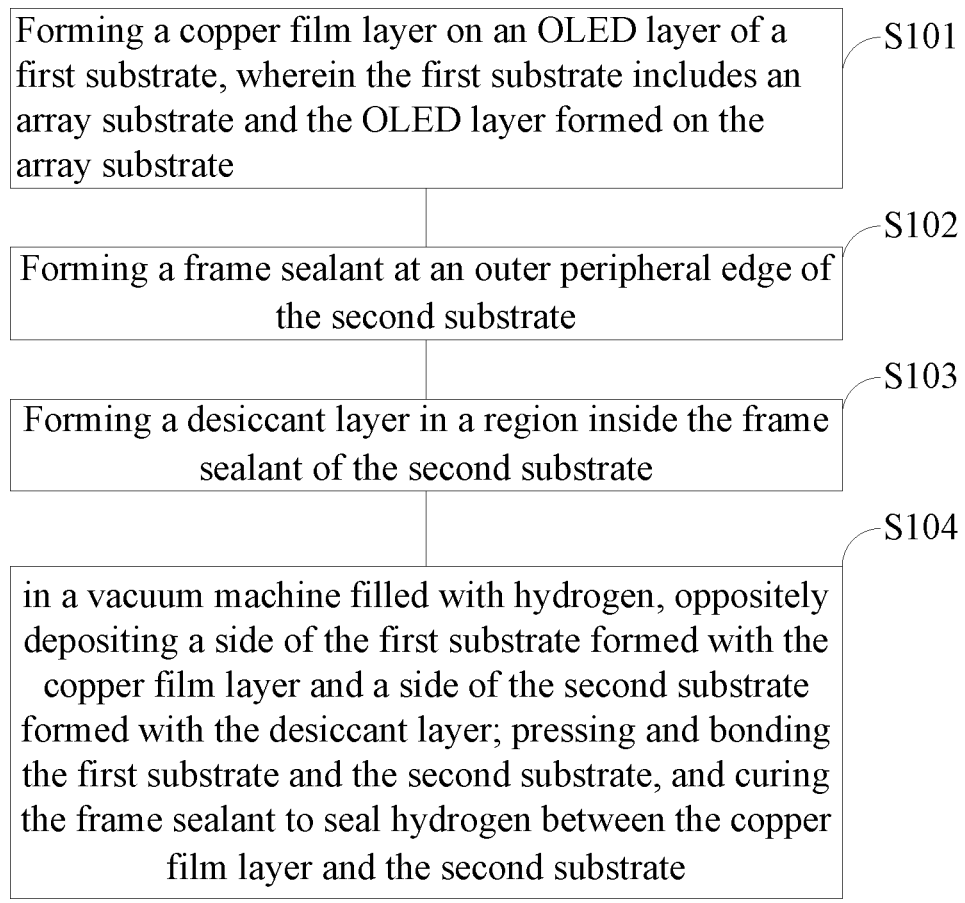
FIG. 1 is a flow chart of a packaging method for OLED display provided by a first embodiment of the present invention.

With reference to FIG. 1, and FIG. 1 is a flow chart of a packaging method for OLED display provided by a first embodiment of the present invention.

The packaging method for OLED display of the present embodiment includes following steps:

S101: forming a copper film layer on an OLED layer of a first substrate, wherein the first substrate includes an array substrate and the OLED layer formed on the array substrate.

Specifically, the array substrate is a TFT (Thin Film Transistor) array substrate. The OLED layer includes an anode sublayer, a hole-transporting sublayer, a light-emitting sublayer, an electron-transporting sublayer and a metal cathode sublayer. Wherein, the anode sublayer is electrically connected to a positive electrode of a power source, and the metal cathode sublayer is electrically connected to a negative electrode of the power source. When the power source provides an appropriate voltage, holes in the anode sublayer and electrons in the cathode sublayer will combine in the light-emitting sublayer to generate light. Based on different composition of the light-emitting sublayer, three primary colors of a red color, a green color and a blue color will be generated to constitute a basic color such that the OLED layer emits a visible light. Wherein, the metal cathode sublayer is formed by more active metal such as Ca/Al or Mg/Ag. The copper film layer is formed on the metal cathode sublayer.

S102: forming a frame sealant at an outer peripheral edge of the second substrate.

Specifically, using the second substrate as a packaging substrate to package the first substrate. The frame sealant is an UV curable adhesive. The UV curable adhesive has advantages of fast curing, low power consumption and no solvent pollution, and the curing principle is: the photoinitiator in the UV curable adhesive is rapidly decomposed into free radicals or cations under an irradiation of a ultraviolet light having appropriate wavelength and light intensity to initiate an unsaturated bond polymerization so that the material is cured.

S103: forming a desiccant layer in a region inside the frame sealant of the second substrate.

S104: in a vacuum machine filled with hydrogen, oppositely depositing a side of the first substrate formed with the copper film layer and a side of the second substrate formed with the desiccant layer. Then, pressing and bonding the first substrate and the second substrate, and curing the frame sealant in order to seal hydrogen between the copper film layer and the second substrate.

Specifically, when $O_2$ enters inside the OLED display, Cu in the copper layer will react with the $O_2$ to produce CuO so as to remove the $O_2$. When OLED display emits light and generates heat, the CuO is reduced to Cu and produces $H_2O$. Because the copper film layer and the desiccant layer are disposed oppositely so that the produced $H_2O$ can be absorbed by desiccant in the desiccant layer in order to prevent water and oxygen from damaging the OLED layer, and the Cu in the copper film layer can be used repeatedly so as to extend the operation life of the OLED display device.

The related chemical reaction equation is as following:

-continued

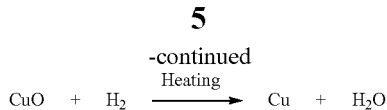

Comparing to the conventional art, the present invention through forming a copper film layer on an OLED layer of a first substrate, forming a desiccant layer in a region inside the frame sealant of the second substrate, in a vacuum machine filled with hydrogen, oppositely depositing a side of the first substrate formed with the copper layer and a side of the second substrate formed with desiccant layer. Then, pressing and bonding the first substrate and the second substrate, and curing the frame sealant in order to seal hydrogen between the copper film layer and the second substrate such that when $O_2$ enters inside the OLED display, Cu in the copper film layer will react with the $O_2$ to produce CuO so as to remove the $O_2$. When OLED display device emits light and generates heat, the CuO is reduced to Cu and produces $H_2O$. because the copper film layer and the desiccant layer are disposed oppositely so that the produced $H_2O$ can be absorbed by desiccant in the desiccant layer in order to prevent water and oxygen from damaging the OLED layer, and the Cu in the copper film layer can be used repeatedly so as to extend the operation life of the OLED display device.

Figure 2:
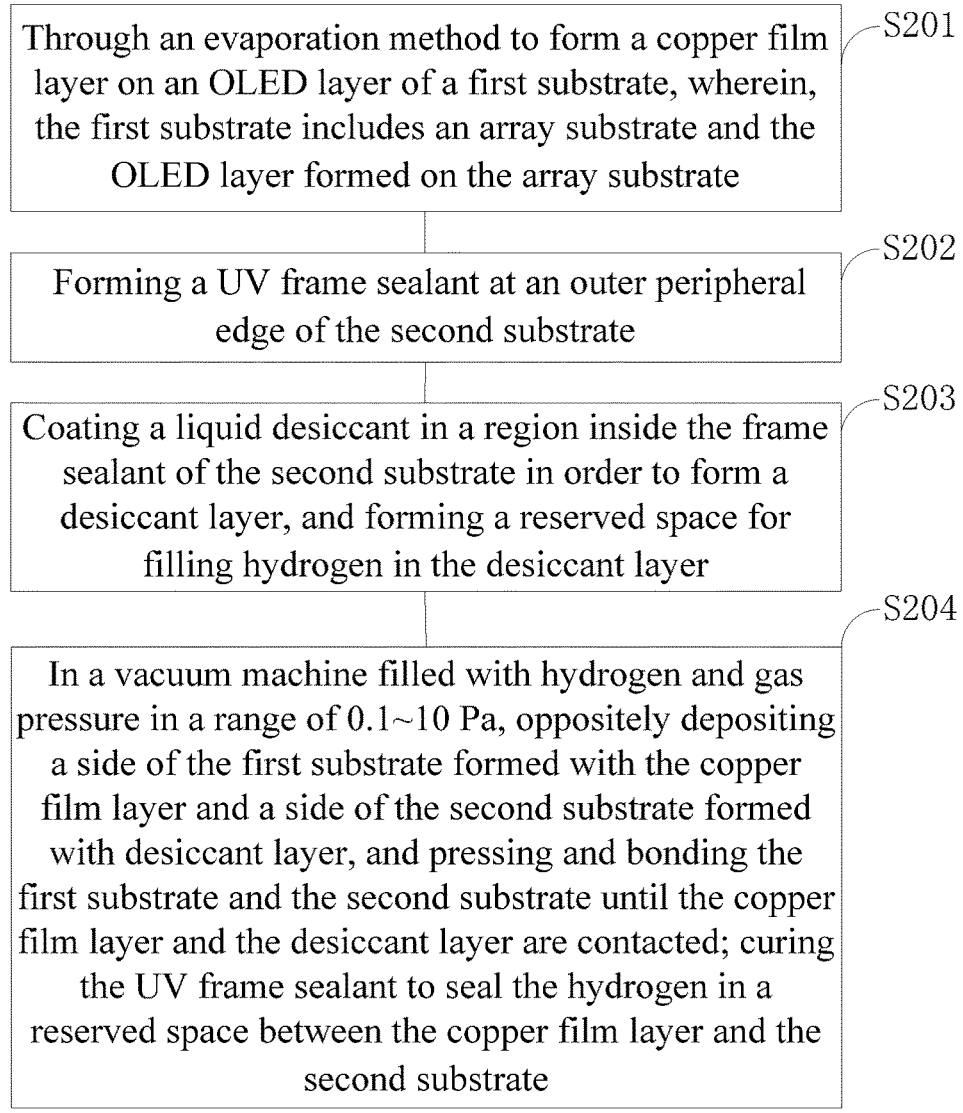
FIG. 2 is a flow chart of a packaging method for OLED display provided by a second embodiment of the present invention.

FIG. 2 is a flow chart of a packaging method for OLED display provided by a second embodiment of the present invention.

The packaging method provided by the embodiment of the present invention includes following steps:

S201: through an evaporation method to form a copper film layer on an OLED layer of a first substrate. Wherein, the first substrate includes an array substrate and the OLED layer formed on the array substrate.

Figure 3:
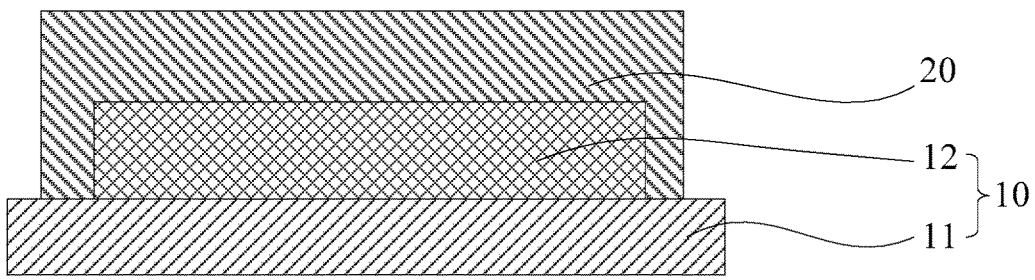
FIG. 3 is a schematic structure diagram after the step S201 in the second embodiment of the present invention.

As shown in FIG. 3 and FIG. 3 is a schematic structure diagram after the step S201 in the second embodiment of the present invention. Wherein, the first substrate 10 includes an array substrate 11 and an OLED layer 12 formed on the array substrate 11. The copper film layer 20 is completely covered on the OLED layer 12 through the evaporation method.

Copper is covered on the OLED layer 12 to form the copper film layer 20 through a vacuum evaporation method. Specifically, the vacuum evaporation coating method is that in a vacuum environment, heating a material and coating the material to a substrate so as to form the vacuum evaporation. Specifically, the vacuum evaporation method places a material waited to form a film in a vacuum environment to perform an evaporation and a sublimation so that the material is formed on a surface of workpiece or a substrate. The method has advantages of simple in operation, high efficiency and pure film, good quality, precise thickness control, fast film forming rate, high efficiency, and simple in exciting film forming.

S202: forming a UV frame sealant at an outer peripheral edge of the second substrate.

Figure 4:
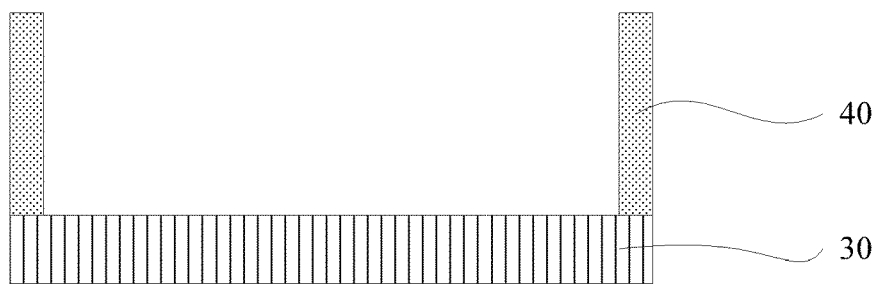
FIG. 4 is a schematic structure diagram after the step S202 in the second embodiment of the present invention.

As shown in FIG. 4, and FIG. 4 is a schematic structure diagram after the step S202 in the second embodiment of the present invention. Wherein, the UV frame sealant 40 is formed at the outer peripheral edge of the second substrate 30 in order to connect and seal the second substrate 30 and the first substrate 10 in a subsequent process.

S203: coating a liquid desiccant in a region inside the frame sealant of the second substrate in order to form a desiccant layer, and forming a reserved space for filling hydrogen in the desiccant layer.

Figure 5:
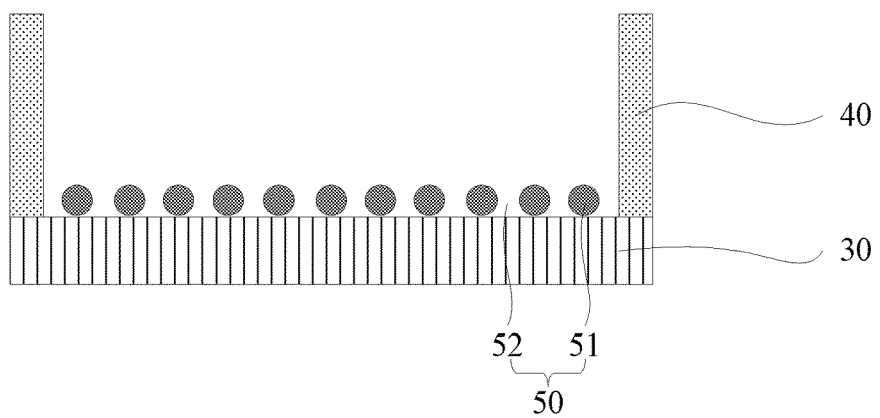
FIG. 5 is a schematic structure diagram after the step S203 in the second embodiment of the present invention.

Specifically, with reference to FIG. 5, and FIG. 5 is a schematic structure diagram after the step S203 in the second embodiment of the present invention. The desiccant layer 50 in the present embodiment forms the reserved space 52. That is, the desiccant 51 is not completely covered on the region inside the frame sealant 40 of the second substrate 30, but only covers a portion of the region, and the remaining region is the reserved space 52 in order to fill hydrogen in the reserved space 52.

For example, the desiccant 51 in the present embodiment is a liquid desiccant, the liquid desiccant appears as a spherical water droplet shape. Multiple water-droplet-shaped desiccants are distributed evenly in the region inside the frame sealant on the second substrate, and an interval between adjacent water-droplet-shaped desiccants is the reserved space 52.

In another embodiment, the liquid desiccant can be coated as a fence shape, a mesh shape, or a spiral shape, the only requirement is to form the reserved space in the desiccant layer.

It can be understood that in other embodiments, a solid desiccant can be adopted to form the desiccant layer 50 having the reserved space 52, and the solid desiccant can be sheet-shaped. The sheet-shaped desiccant layer has multiple holes, and the holes function as the reserved space 52. The sheet-shaped solid desiccant can be formed on the second substrate 30 through adhering. Besides, the desiccant layer 50 can also be formed by multiple sheet-shaped solid desiccants. When adhering, between adjacent sheet-shaped solid desiccants, a gap is reserved, and using the space as a reserved space 52.

In other embodiments, a gap can be formed between the desiccant layer 50 and the copper film layer 20 in order to fill the hydrogen.

S204: in a vacuum machine filled with hydrogen and gas pressure in a range of 0.1~10 Pa, oppositely depositing a side of the first substrate formed with the copper film layer and a side of the second substrate formed with desiccant layer, and pressing and bonding the first substrate and the second substrate until the copper film layer and the desiccant layer are contacted. Curing the UV frame sealant in order to seal the hydrogen in a reserved space between the copper film layer and the second substrate.

Specifically, the vacuum machine is a VAS machine, the gas pressure inside the machine is in a range of 0.1~10 Pa, specifically, 0.1~4 Pa such as 0.1 Pa, 2 Pa or 3.5 Pa, etc. Besides, the gas pressure can also be in a range of 4 Pa-10 Pa such as 4 Pa, 6 Pa, 6.7 Pa, 9 Pa or 10 Pa. The gas pressure inside the machine can be varied in a range of 0.1~10 Pa, and the specific gas pressure value can be decided according to an actual requirement and the range which the machine can achieve. The curing of the UV frame sealant 40 can be achieved through irradiation an UV light.

Figure 6:
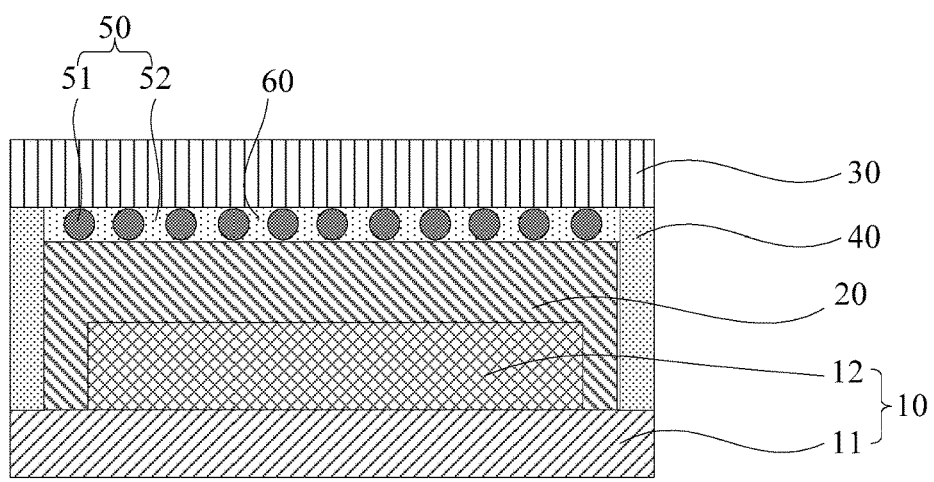
FIG. 6 is a schematic structure diagram of an OLED finally formed in the second embodiment of the present invention.

As shown in FIG. 6, and FIG. 6 is a schematic structure diagram of an OLED finally formed in the second embodiment of the present invention. In the present embodiment, the copper film layer 20 on the first substrate 10 is deposited oppositely to the desiccant layer 50 on the second substrate 30, and the desiccant layer 50 is contacted with the copper film layer 20 in order to ensure that the hydrogen 60 inside the reserved space 52 can be contacted with the copper film layer 20 so that the hydrogen 60 can directly contact with the CuO formed on the copper film layer 20. Accordingly, when the OLED display emits light and generates heat, the CuO is reduced to Cu by the hydrogen 60 so that the copper film layer can repeatedly react with $O_2$ entering into the display. Besides, the contact between the desiccant 51 and the copper film layer 20 is ensured such that the $H_2O$ produced from reducing the CuO to Cu by $H_2$ is directly absorbed by the desiccant 51 in order to prevent the $H_2O$ and the $O_2$ from damaging the OLED layer.

The present invention also provides an OLED display device, specifically, with reference to FIG. 6, the OLED display device includes a first substrate 10, a copper film layer 20, a desiccant layer 50 and a second substrate 30. Wherein, the copper film layer 20 is formed on the first substrate 10, the desiccant layer 50 is disposed on the copper film layer 20, the second substrate 30 is disposed on the desiccant layer 50. Outer peripheral edges of the second substrate 30 and the first substrate 10 are connected and sealed through the frame sealant 40. Besides, hydrogen 60 is filled between the copper film layer 20 and the second substrate 30.

Specifically, the first substrate 10 includes an array substrate 11 and an OLED layer 12. The OLED layer 12 is disposed in the array substrate 11. The copper film layer 20 is formed on the OLED layer 12. Specifically, the copper film layer 20 is covered on a metal cathode sublayer of the OLED layer 12.

The desiccant layer 50 is disposed on the copper film layer 20. Wherein, the desiccant 51 can be a liquid desiccant or a solid desiccant.

Specifically, the desiccant layer 50 in the present embodiment forms a reserved space 52. The desiccant 51 is evenly distributed, and the reserved space 52 is also evenly distributed. The desiccant layer 50 is contacted with the copper film layer 20.

For example, in some embodiments, the desiccant 51 is a liquid desiccant, and the liquid desiccant appears as a spherical water droplet shape. Multiple water-droplet-shaped desiccants are distributed in the region inside the frame sealant on the second substrate, and an interval between adjacent water-droplet-shaped desiccants is the reserved space 52.

In another embodiment, the liquid desiccant can be coated as a fence shape, a mesh shape, or a spiral shape.

It can be understood that in other embodiments, a solid desiccant can be adopted to form the desiccant layer 50 having the reserved space 52, and the solid desiccant can be sheet-shaped. The sheet-shaped desiccant layer forms multiple holes, and the holes function as the reserved space 52. The sheet-shaped solid desiccant can be formed on the second substrate 30 through adhering. Besides, the desiccant layer 50 can also be formed by multiple sheet-shaped solid desiccants. When adhering, between adjacent sheet-shaped solid desiccants, a gape is reserved, and using the space as the reserved space 52.

In the present embodiment, the desiccant layer 50 is contacted with the copper film layer 20 in order to ensure that the hydrogen 60 can directly contact with the CuO formed on the copper film layer 20. Accordingly, when the OLED display emits light and generates heat, the CuO is reduced to Cu by the hydrogen 60 so that the copper film layer can repeatedly react with $O_2$ entering into the display. Besides, the contact between the desiccant 51 and the copper film layer 20 is ensured such that the $H_2O$ produced from reducing the CuO to Cu by $H_2$ is directly absorbed by the desiccant 51 in order to prevent the $H_2O$ and the $O_2$ from damaging the OLED layer.

In summary, the present invention can effectively increase the packaging effect and extend the operation life of the OLED display device.

The above embodiments of the present invention are not used to limit the claims of this invention. Any use of the content in the specification or in the drawings of the present invention which produces equivalent structures or equivalent processes, or directly or indirectly used in other related technical fields is still covered by the claims in the present invention.

What is claimed is:

1. A packaging method for an OLED display, comprising steps of:
   forming a copper film layer on an OLED layer of a first substrate through an evaporation method, wherein the first substrate includes an array substrate and the OLED layer formed on the array substrate;
   forming a frame sealant at an outer peripheral edge of a second substrate;
   forming a desiccant layer in a region inside the frame sealant of the second substrate; and
   in a vacuum machine filled with hydrogen, oppositely depositing a side of the first substrate formed with the copper film layer and a side of the second substrate formed with the desiccant layer; pressing and bonding the first substrate and the second substrate; curing the frame sealant in order to seal hydrogen between the copper film layer and the second substrate, wherein a gas pressure in the vacuum machine is 0.1-10 Pa.

2. The packaging method for an OLED display according to claim 1, wherein, in the step of forming a desiccant layer in a region inside the frame sealant of the second substrate, the desiccant layer is a liquid desiccant, and the liquid desiccant is formed on the second substrate through coating.

3. The packaging method for an OLED display according to claim 1, wherein, in the step of forming a desiccant layer in a region inside the frame sealant of the second substrate, the desiccant layer is provided with a reserved space;
   after pressing and bonding the first substrate and the second substrate, the hydrogen is filled in the reserved space; the desiccant layer is contacted with the copper film layer.

4. The packaging method for an OLED display according to claim 1, wherein, in the step of forming a desiccant layer in a region inside the frame sealant of the second substrate, the desiccant layer is a solid desiccant, and the solid desiccant is formed on the second substrate through adhering.

5. A packaging method for an OLED display, comprising steps of:
   forming a copper film layer on an OLED layer of a first substrate, wherein the first substrate includes an array substrate and the OLED layer formed on the array substrate;
   forming a frame sealant at an outer peripheral edge of a second substrate;
   forming a desiccant layer in a region inside the frame sealant of the second substrate; and
   in a vacuum machine filled with hydrogen, oppositely depositing a side of the first substrate formed with the copper film layer and a side of the second substrate formed with the desiccant layer; pressing and bonding the first substrate and the second substrate; curing the frame sealant in order to seal hydrogen between the copper film layer and the second substrate.

6. The packaging method for an OLED display according to claim 5, wherein, in the step of forming a copper film layer on an OLED layer of a first substrate, the copper film layer is formed on the OLED layer through an evaporation method.

7. The packaging method for an OLED display according to claim 5, wherein, in the step of forming a desiccant layer in a region inside the frame sealant of the second substrate, the desiccant layer is a liquid desiccant, and the liquid desiccant is formed on the second substrate through coating.

8. The packaging method for an OLED display according to claim 5, wherein, in the step of in a vacuum machine filled with hydrogen, oppositely depositing a side of the first substrate formed with the copper film layer and a side of the second substrate formed with the desiccant layer; pressing and bonding the first substrate and the second substrate, a gas pressure in the vacuum machine is 0.1-10 Pa.

9. The packaging method for an OLED display according to claim 5, wherein, in the step of forming a desiccant layer in a region inside the frame sealant of the second substrate, the desiccant layer is provided with a reserved space;

after pressing and bonding the first substrate and the second substrate, the hydrogen is filled in the reserved space; the desiccant layer is contacted with the copper film layer.

10. The packaging method for an OLED display according to claim 9, wherein, the desiccant is a liquid desiccant, the liquid desiccant is coated as multiple water-droplet shaped particles disposed separately or coated as a fence shape, a mesh shape, or a spiral shape.

11. The packaging method for an OLED display according to claim 5, wherein, the frame sealant is a UV curable adhesive.

12. The packaging method for an OLED display according to claim 5, wherein, in the step of forming a desiccant layer in a region inside the frame sealant of the second substrate, the desiccant layer is a solid desiccant, and the solid desiccant is formed on the second substrate through adhering.

13. The packaging method for an OLED display according to claim 9, wherein, the desiccant is a solid desiccant, the solid desiccant is sheet-shaped, the sheet-shaped desiccant forms multiple holes as the reserved space; or, the number of the sheet-shaped desiccant is multiple, between adjacent sheet-shaped desiccants, a gap is reserved as the reserved space.

* * * * *